US012716127B2

(12) United States Patent
Steinmuller et al.

(10) Patent No.: US 12,716,127 B2
(45) Date of Patent: Aug. 25, 2026

(54) METHOD FOR APPLYING A DOPED DIAMOND LAYER TO A SUBSTRATE BY CHEMICAL VAPOUR DEPOSITION

(71) Applicants: CARBONCOMPETENCE GMBH, Wattens (AT); YG-1 CO., LTD., Incheon (KR)

(72) Inventors: Detlef Steinmuller, Aldrans (AT); Doris Steinmuller-Nethl, Aldrans (AT); Maximilian Steinmuller, Innsbruck (AT)

(73) Assignees: CARBONCOMPETENCE GMBH, Wattens (AT); YG-1 CO., LTD., Incheon (KR)

( * ) Notice: Subject to any disclaimer, the term of this patent is extended or adjusted under 35 U.S.C. 154(b) by 0 days.

(21) Appl. No.: 18/692,836

(22) PCT Filed: Oct. 21, 2022

(86) PCT No.: PCT/AT2022/060363
§ 371 (c)(1),
(2) Date: Mar. 18, 2024

(87) PCT Pub. No.: WO2023/064972
PCT Pub. Date: Apr. 27, 2023

(65) Prior Publication Data

US 2024/0425977 A1 Dec. 26, 2024

(30) Foreign Application Priority Data

Oct. 22, 2021 (AT) .............................. A 50843/2021

(51) Int. Cl.
*C23C 16/27* (2006.01)

(52) U.S. Cl.
CPC .......... *C23C 16/278* (2013.01); *C23C 16/271* (2013.01); *C23C 16/277* (2013.01)

(58) Field of Classification Search
CPC ..... C23C 16/27; C23C 16/271; C23C 16/277; C23C 16/278
See application file for complete search history.

(56) References Cited

U.S. PATENT DOCUMENTS 4,961,958 A * 10/1990 Desphandey ....... C23C 14/0021 427/523
5,382,808 A * 1/1995 Dreifus .................. H10D 64/62 257/77
5,591,484 A 1/1997 Poncelet et al.
5,635,258 A * 6/1997 Chen ..................... C23C 16/278 427/249.11
6,274,837 B1 * 8/2001 Windischmann ..... C23C 16/276 427/580
10,487,396 B2 11/2019 Choi et al.
2004/0180205 A1 * 9/2004 Scarsbrook ........... C30B 25/105 428/408
2005/0227079 A1 * 10/2005 Ravi ....................... C23C 16/26 427/249.1
2006/0175953 A1 * 8/2006 Swain .................. C25B 11/073 313/311
2008/0069972 A1 * 3/2008 Chaffin, III ........... C23C 16/279 427/577
2010/0329965 A1 * 12/2010 Twitchen ............. C23C 16/277 117/88
2013/0234165 A1 * 9/2013 Bourban ............... C23C 16/279 438/105
2014/0004032 A1 * 1/2014 Baik ...................... C01B 32/26 422/198
2015/0259790 A1 * 9/2015 Newman ................ B01J 19/088 118/712
2019/0071779 A1 * 3/2019 Hamers ............... C23C 16/0281
2019/0226117 A1 * 7/2019 Steinmuller-Nethl ...................... C23C 16/45502

FOREIGN PATENT DOCUMENTS

| | | | | |
|---|---|---|---|---|
| CN | 104862663 A | 8/2015 | | |
| CN | 108396309 A | 8/2018 | | |
| CN | 108505018 | * 9/2018 | ............ | C23C 16/27 |
| CN | 108565124 A | 9/2018 | | |
| CN | 110527973 A | 12/2019 | | |
| CN | 111304690 A | 6/2020 | | |
| CN | 111778506 A | 10/2020 | | |
| CN | 111945131 A | 11/2020 | | |
| CN | 112063996 A | 12/2020 | | |

(Continued)

OTHER PUBLICATIONS

Zaitsev, A.M., et al., "Nitrogen-doped CVD diamond: Nitrogen concentration, color and internal stress". Diamond & Related Materials 105 (2020) 107794, pp. 1-13.*

(Continued)

*Primary Examiner* — Bret P Chen
(74) *Attorney, Agent, or Firm* — Kilyk & Bowersox, P.L.L.C.

(57) ABSTRACT

A device (1) and a process for applying a doped diamond layer to a substrate (2, 2a) by chemical vapour deposition. The device (1) has a deposition chamber for holding the substrate (2, 2a), a gas activation element (7) in the form of a hollow body with a flow channel (7b) for a process gas, in particular hydrogen, an outlet opening (16) leading from the flow channel (7b) into the deposition chamber (3), a heating device (8) for heating a wall (7a) of the gas activation element (7) surrounding the flow channel (7b) and a solid precursor, other than carbon, within the flow channel (7b).

7 Claims, 5 Drawing Sheets

(56) References Cited

FOREIGN PATENT DOCUMENTS

| | | | | | |
|---|---|---|---|---|---|
| DE | 69504800 | T2 | | 5/1999 | |
| EP | 0320657 | A1 | | 6/1989 | |
| EP | 1340837 | A1 | | 9/2003 | |
| EP | 1780315 | B1 | * | 4/2015 | ............. C30B 35/10 |
| GB | 2486778 | | * | 6/2013 | ............. C23C 16/27 |
| JP | 8-502234 | A | | 3/1996 | |
| JP | 4259899 | | * | 2/2009 | ............. C23C 14/32 |
| WO | 9407613 | A2 | | 4/1994 | |
| WO | 9506143 | A1 | | 3/1995 | |
| WO | WO 98/27568 | | * | 6/1998 | ................ H01J 9/02 |
| WO | WO 2018/064694 | A1 | * | 4/2018 | ............. C30B 25/10 |

OTHER PUBLICATIONS

Polushin, Nikolay Ivanovich, et al., "Deposition of Boron-Doped Thin CVD Diamond Films from Methane-Triethyl Borate-Hydrogen Gas Mixture". Processes 2020, 8, 666, pp. 1-13.*

Pinault-Thaury, Marie-Armandine, et al., "Phosphorus-doped (113) CVD diamond: A breakthrough towards bipolar diamond devices". Applied Physics Letters, 114, 112106 (2019), pp. 1-5.*

Kwak, Taemyung, et al., "Boron-Doped Single-Crystal Diamond Growth on Heteroepitaxial Diamond Substrate Using Microwave Plasma Chemical Vapor Deposition". Phys. Status Solidi A 2020, 217, 1900973, pp. 1-5.*

Okano, Ken, et al., "Characterization of Boron-Doped Diamond Film". Japanese Journal of Applied Physics, vol. 28, No. 6, Jun. 1989, pp. 1066-1071.*

Almedia, E.C., et al., "Electrochemical characterization of doped diamond-coated carbon fibers at different boron concentrations". Thin Solid Films, 485 (2005) 241-246.*

Sankaran, Kamatchi Jothiramalingam, et al., "Boron-Doped Nanocrystalline Diamond-Carbon Nanospike Hybrid Electron Emission Source". ACS Applied Materials & Interfaces, 2019, 11, 48612-48623.*

International Preliminary Report on Patentability (with English translation) issued in corresponding International Patent Application No. PCT/AT2022/060363 mailed May 2, 2024 (8 pages).

International Search Report and Written Opinion issued in corresponding International Patent Application No. PCT/AT2022/060363 (with English translation of International Search Report) mailed Feb. 3, 2023 (12 pages).

Office Action issued in corresponding Austrian Patent Application No. A 50843/2021 dated May 12, 2022 (2 pages).

Klauser et al., "Raman Studies of Nano- and Ultra-nanocrystalline Diamond Films Grown by Hot-Filament CVD**," Chemical Vapor Deposition, 2010, vol. 16, pp. 127-135.

Muller et al., "On the ion-sensitivity of H-terminated surface channel devices on diamond", Diamond and Related Materials, www.elsevier.com/locate/diamond, Mar. 1, 2002, vol. 11, No. 3-6, pp. 651-656.

Zaitsev, "Optical Properties of Diamond: Data Handbook," 1st ed., Springer, 2001 (519 pages).

Office Action issued in corresponding Korean Patent Application 10-2024-7016496 issued Jan. 8, 2026 (13 pages).

* cited by examiner

METHOD FOR APPLYING A DOPED DIAMOND LAYER TO A SUBSTRATE BY CHEMICAL VAPOUR DEPOSITION

This application is a National Stage Application of PCT/AT2022/060363, filed Oct. 21, 2022, which claims priority to Austrian Patent Application No. A 50843/2021, filed Oct. 22, 2021.

The present invention relates to a device and a method for applying a doped diamond layer to a substrate by chemical vapour deposition.

Chemical vapour deposition (CVD) processes enable the coating of complex, three-dimensionally shaped surfaces, as the finest recesses or even hollow bodies can be evenly coated on the inside. The various CVD diamond coating technologies differ mainly in the gas activation and gas dissociation methods. The main distinguishing features are growth rates, coating area and quality of the diamond layer. High growth rates are usually limited to very small coating areas. The "hot filament" process (HFCVD process) has become established for coating three-dimensional, complex substrates, as this process can also be used to coat three-dimensional substrates on larger surfaces. Plasma processes are mainly used for two-dimensional substrates (e.g. Si wafers), as localised electrical field enhancements and a denser plasma occur on three-dimensional surfaces and the layers cannot be deposited homogeneously.

WO 2018/064694 A1 describes a CVD device and a CVD process for applying a carbon layer, in particular a diamond layer, to a substrate. A process gas, hydrogen or a mixture of hydrogen and a carbon-containing gas, is introduced into the flow channel of a gas inlet- and gas activation-element. The process gas is activated by a combination of thermal excitation and impact excitation and then flows in a locally controlled manner through outlet openings into the deposition chamber in which the substrate is located. This combination of thermal excitation and impact excitation of the process gas leads to a significantly higher excitation rate of the atomic hydrogen, a higher growth rate, a homogeneous deposition of the carbon layer (diamond layer) on the substrate and better control of the coating process, which is particularly advantageous for large coating areas and/or complex-shaped substrates.

Single-crystal diamond is highly electrically insulating and has the lowest specific electrical conductivity of all known materials at $10^{-18}$ S/m. Diamond layers can be doped using a CVD process in order to modulate the electrical, optical and structural properties. By suitable doping (e.g. with elements of the IVth, Vth and VIth main groups; with transition metals; with elements of the IVth, Vth and VIth subgroups), diamond can be a semiconductor (p- or n-type). Electrically conductive diamond layers are used, for example, as semiconductor material, electrode material in electrochemistry, material for transducers, for example for sensors or in microsystems technology (MEMS), or as a coating layer for detecting wear or for contact drilling, for example in printed circuit boards.

The impurity atoms can replace both the C atoms on regular lattice sites, and thus have a purely extrinsic character. It is known that impurity atoms such as H, He, Li, B, N, O, Ne, P, Si, As, Ti, Cr, Ni, Co, Zn, Zr, Ag, W, Xe and Tl form optically active centres in diamond (A. M. Zaitsev, Optical properties of diamond: a data handbook, 1st ed., Springer, 2001). In polycrystalline diamond layers, the grain boundaries play a further important role in doping. In general, the aim is to "incorporate" the impurity atoms into the diamond lattice. The smaller the deposited diamond crystals are, the higher the number of grain boundaries between the crystals in relation to a certain area. These grain boundaries contain, among other things, non-diamond-like carbon (e.g. transpolyacetylene; Frederik Klauser, Doris Steinmüller-Nethl et al.: Raman Studies of Nano- and Ultra-nanocrystalline Diamond Films Grown by Hot-Filament CVD, Chemical Vapour Deposition, Vol. 16, Issue 4-6, pp. 127-135, 2010). Therefore, preferably in nanocrystalline diamond films (crystallites in the range of 2 to 100 nm), the boron can be incorporated not only into the diamond lattice but also into the amorphous grain boundaries.

The use of boron-doped diamond layers in particular is widespread, as boron atoms have a similar atomic radius to carbon atoms, meaning that the lattice distortion when incorporating boron atoms into the carbon lattice is comparatively low. Boron has three outer electrons, one less than carbon, so that boron acts as an electron acceptor in the carbon lattice and boron-doped diamond is p-conductive. The ionisation energy of boron is very low at 0.37 eV, meaning that boron-doped diamond achieves good electrical conductivity even at room temperature.

As described in US 2013/0234165 A1, solid, liquid or gaseous boron sources can be used in the CVD process to deposit boron-doped diamond layers. The use of liquid or gaseous (usually toxic) boron sources is particularly widespread. In U.S. Pat. No. 10,487,396 B2, CN 108396309 A, CN 111778506 A and CN 111304690 A, a gaseous boron-containing precursor is used, while in CN 108565124 B, trimethyl borate is used as a liquid boron-containing precursor. In CN 104862663 A, for example, acetone is used as the carbon source and trimethyl borate as the liquid boron source, whereby a boron-doped nanodiamond film with a layer thickness of 1 to 10 μm is deposited on a monocrystalline silicon substrate.

The large-scale use of liquid or gaseous precursors other than carbon in the CVD process is often associated with health risks. For example, boron or boron compounds, such as diborane (also known as borethane) or trimethyl borate, are highly toxic and their absorption into the human body can lead to chronic poisoning or damage the central nervous system and kidneys. Diborane is also highly self-igniting and explosive, which can cause severe burns, and trimethyl borate is highly corrosive, which damages the equipment used in the CVD process and shortens its service life if used over a longer period of time.

The use of solid, non-carbon precursors (instead of liquid or gaseous ones) in the CVD process has immense advantages in terms of safety and health aspects. Methods for producing doped diamond coatings using a solid, non-carbon precursor in the CVD-process are disclosed in several documents.

In the method described in CN 111945131 A and CN 112063996 A, solid boron carbide particles are evenly distributed around a substrate. Hydrogen, argon and methane are used as process gases. Boron and carbon radicals are produced from boron carbide particles by activation using microwave plasma and a boron-doped diamond layer is deposited on the substrate surface. In CN 110527973 A, a carbon source (graphite powder) and a boron source (boron powder or boron oxide powder) are mixed and pressed into a bulk material in the form of a wafer. In a CVD process, several of these wafers are placed evenly around a substrate and a gas, either hydrogen or a mixture of hydrogen, methane and inert gas, is fed in. The gas is activated by microwave radiation, which generates a plasma.

To summarise, the CVD processes known in the prior art for producing doped diamond coatings usually use a gaseous or liquid precursor that is different from carbon, which entails health and safety risks. In the few known CVD processes that use solid precursors other than carbon, the process gas is activated exclusively by means of plasma. However, plasma activation can damage the crystalline structure of the substrate materials and homogeneous coating of three-dimensional objects is very difficult.

It is therefore a task of the invention to produce doped diamond layers in a CVD process that does not use plasma, using a solid precursor that is different from carbon, thus avoiding the disadvantages of the CVD processes known in the prior art.

This problem is solved by a device as described herein and a method as described herein. Preferred embodiments are described herein.

The invention relates to a device for applying a doped diamond layer to a substrate by chemical vapour deposition, comprising a deposition chamber for receiving the substrate, a gas activation element in the form of a hollow body with a flow channel for a process gas, in particular hydrogen, an outlet opening leading from the flow channel into the deposition chamber, a heating device for heating a wall of the gas activation element surrounding the flow channel and a solid precursor, other than carbon, within the flow channel.

The invention also relates to a process for applying a doped diamond layer to a substrate by chemical vapour deposition comprising the steps of:

(a) Providing the substrate and a gas activation element in the form of a hollow body with a flow channel in a deposition chamber,
(b) Providing a precursor other than carbon in the solid state within the flow channel,
(c) Heating a wall surrounding the flow channel of the gas activation element with a heating device,
(d) Introducing a process gas, in particular hydrogen, into the flow channel of the gas activation element,
(e) Activation of the process gas by impact excitation and thermal excitation, and activation of the precursor by thermal excitation,
(f) introducing the activated process gas and the activated precursor into the deposition chamber through an outlet port of the gas activation element, and
(g) Deposition of a doped diamond layer on the substrate.

The invention also relates to the use of the device for thermal excitation and impact excitation of the process gas and for thermal excitation of the solid precursor other than carbon for depositing a doped diamond layer on a substrate by chemical vapour deposition.

Surprisingly, it has been found that by providing a solid, non-carbon precursor within the flow channel of a gas activation element of the CVD device according to the invention, the deposition of a homogeneous, doped diamond layer on a substrate is made possible. By using a solid, precursor other than carbon for doping, negative effects on health and/or process safety, as they occur with liquid or gaseous, precursors other than carbon, can be completely avoided. The use of a combined activation by thermal activation and impact excitation enables the deposition of a homogeneous, doped diamond layer even on three-dimensional substrates.

A process gas, preferably hydrogen or a mixture of hydrogen and another gas, such as a carbon-containing gas, is fed via a gas feed element into a gas activation element that is preferably arranged perpendicularly to it. The gas activation element is in the form of a hollow body with a lateral surface and has a flow channel for the process gas and a wall surrounding the flow channel, which is heated by means of a heating device. The process gas is preferably introduced into the flow channel of the gas activation element via two gas feed elements, which are arranged in the two end regions of the lateral surface of the gas activation element. This ensures a homogeneous distribution of the process gas in the flow channel of the gas activation element.

The wall of the gas activation element is preferably heated over its entire length by means of a heating device in order to ensure a homogeneous temperature distribution. For this purpose, the wall of the gas activation element is connected to a heating device, which heats the wall of the gas activation element. The wall of the gas activation element is preferably heated by a resistance heater. This enables simple and precise control of the heating process.

The process gas and the solid precursor other than carbon, which is arranged in the flow channel of the gas activation element, are preferably heated to at least 2000° C., preferably to at least 2200° C., particularly preferably to at least 2400° C., in order to achieve good thermal excitation of the process gas. The process gas, particularly preferably hydrogen, is activated by impact excitation and thermal excitation, while the solid precursor, which is different from carbon, is activated by thermal excitation. The activated process gas and the activated solid precursor are then transported through the at least one outlet opening of the gas activation element to the substrate arranged in the deposition chamber.

The cross-sectional area of the flow channel is preferably in the range of 0.1 to 50 $mm^2$, particularly preferably in the range of 5 to 30 $mm^2$. This increases the impact excitation with the wall. The flow channel of the gas activation element is preferably closed at both ends, for example by end bodies, so that the gas activation element has no other openings apart from an inlet opening and an outlet opening. The ratio between the area of exactly one outlet opening and the cross-sectional area of the gas activation element is preferably 1:5 to 1:20, in particular 1:10, which further increases the excitation rate of the process gas. Due to the small number of openings and the closed flow channel at both ends, there is a significant increase in the partial pressure in the flow channel within the gas activation element, which is many times higher than the pressure in the deposition chamber. In addition to thermal excitation, this high partial pressure also enables impact excitation (i.e. collision-induced dissociation) of the process gas, preferably hydrogen, which leads to a very high yield of atomic hydrogen. This combined activation consisting of thermal excitation and impact excitation can achieve an excitation rate of atomic hydrogen of 80% and more, whereas thermal excitation alone leads to an excitation rate of only up to 30%. This high excitation rate through combined thermal and impact excitation enables an acceleration of the growth of doped diamond layers with high purity and an energy-efficient deposition with high growth rates.

The mean free path length of the hydrogen radicals can increase to several centimetres due to the high excitation rate through combined thermal and impact excitation. This makes it possible to increase the distance between the gas activation element and the substrate, which significantly improves the homogeneity of the deposited doped diamond layer.

In a preferred embodiment of the present invention, the solid precursor other than carbon is preferably selected from the group comprising boron, silicon, lithium, sodium, phosphorus, nitrogen, sulphur, arsenic or a combination thereof. These elements are particularly suitable for doping a diamond layer, for example for incorporation into the diamond lattice, and enable the diamond layer to be provided with certain properties, such as electrical conductivity. The solid precursor can be provided in various forms, for example in the form of particles (e.g. pieces, powder) or in the form of a wire. The solid precursor, which is different from carbon, is preferably a boron-containing precursor, as boron-doped diamond layers have very good electrical conductivity. Due to the ease of handling, boron-containing particles, a boron-containing wire or a combination thereof is or are particularly preferred as the solid precursor.

If a boron-containing wire is used as a solid precursor in the present invention, its diameter is preferably in the range of 0.05 to 2.2 mm, particularly preferably in the range from 0.1 to 0.5 mm. This allows the degree of doping to be varied and adjusted very precisely in order to customise the properties of the deposited doped diamond layer. Furthermore, a diameter in this range ensures that the reservoir of solid precursor in the flow channel is available for a long time, which enables the production of doped diamond layers with a greater layer thickness.

In a preferred embodiment, the boron-containing wire is essentially arranged along the entire length of the flow channel of the gas activation element. This leads to a particularly uniform and homogeneous doping of the entire diamond layer. Furthermore, several, preferably two or three, boron-containing wires are preferably provided as a solid precursor in the flow channel of the gas activation element. This not only ensures very good process control, but the deposited doped diamond layer is also very homogeneous.

The structure or chemical composition of the solid precursor can be varied in order to adjust the doping concentration accordingly. For example, in the case of a boron-containing wire, the wire core can consist of chemical elements or compounds other than boron, such as tungsten or tantalum. This not only ensures stable process control, but also achieves the best result in terms of homogeneity and electrical conductivity of a boron-doped diamond layer.

Depending on the desired doping concentration, a corresponding amount of solid precursor is provided in the flow channel, which can be vaporised in a controlled manner using the process parameters. The doping concentration in the diamond layer can be influenced in a controlled manner by various parameters. On the one hand, the doping concentration can be controlled by process parameters, for example the flow rate of the process gas, the temperature and the pressure, both in the flow channel and in the deposition chamber. On the other hand, the doping concentration can be influenced by the geometry of the device according to the invention, for example the number and/or geometry of the outlet opening and the distance of the substrate from the gas activation element, and by the amount of solid precursor.

The preferably horizontal arrangement of the gas activation element in the deposition chamber allows the solid precursor to be placed in the flow channel so that it rests on the inside of the outer/lateral surface of the gas activation element at the bottom. If the ends of the flow channel are closed, for example by an end body, a solid precursor can alternatively also be attached to these closed ends and thus placed in any possible position in the flow channel.

In a preferred embodiment of the present invention, a gas inlet element for introducing a further process gas, particularly a carbon-containing process gas, is arranged in the deposition chamber in such a way that the further process gas flows over the heated wall of the gas activation element. The other, preferably carbon-containing, process gas is preferably methane, but the use of other carbon-containing process gases, such as ethylene or acetylene, is also possible. This additional process gas is thermally activated by flowing over the heated wall of the gas inlet element so that carbon-containing radicals, such as methyl radicals, are formed by homolytic fission. The effectiveness of the excitation is further increased by collisions of the activated hydrogen with the carbon-containing process gas. The highest possible excitation rate of hydrogen, which is achieved in the device according to the invention by the combined thermal excitation and impact excitation, is accordingly of great importance in order to achieve a high excitation rate of the carbon-containing process gas. The carbon-containing radicals formed can be deposited on the substrate surface not only in the form of $sp^3$-hybridised carbon (diamond), but also as sp- and/or $sp^2$-hybridised carbon. However, the activated, atomic hydrogen prevents or removes these undesirable sp and $sp^2$ hybridisation forms, so that $sp^3$ hybridisation and thus the formation of a pure, doped diamond structure is promoted. The higher the amount of activated hydrogen, the more efficient the suppression or removal of the undesired hybridisation forms. This enables the deposition of high-purity, doped diamond crystals in the micrometre and/or nanometre range on the substrate.

The activated process gas, preferably hydrogen, and the activated precursor are introduced from the gas activation element into the deposition chamber through the outlet opening, which is preferably located on the outer/lateral surface of the gas activation element. The outlet opening is preferably not orientated vertically downwards, but laterally in order to prevent the precursor from flowing out in the molten state. Several outlet openings can also be provided at defined (regular or irregular) distances from each other, which are preferably arranged alternately at an angle to each other in order to cover a larger volume range for the coating. This is particularly advantageous when coating three-dimensional substrates. The geometry and arrangement of the outlet openings depends on the required degree of activation and the flow velocity. With a large number of (preferably small) outlet openings, the process gas is distributed homogeneously in the deposition chamber so that the deposited doped diamond layer has a very uniform thickness and very high homogeneity. An advantageous arrangement and geometry of the outlet opening(s) can be determined for the respective CVD device by means of flow simulation. By arranging several outlet openings accordingly, the process gas can be introduced into the deposition chamber in a spatially evenly distributed manner so that homogeneous deposition over the entire substrate surface is guaranteed. The flow of the process gas together with the precursor through the outlet opening is not impeded due to the small particle size. Depending on the position of the substrate, the gas activation element can be positioned above or to the side of the substrate.

Hydrogen and the carbon-containing process gas can be introduced separately into the deposition chamber. Hydrogen is fed into the deposition chamber through the gas activation element and the carbon-containing process gas is fed through the gas inlet element over the hot gas activation element. This provides greater flexibility with regard to the process parameters. For example, the separate introduction enables a spatially and/or temporally separated gas inlet. As a result, the temperature, gas inlet speed into the deposition chamber, time sequence and/or concentration of these components of the process gas can be individually adjusted. These parameters can be optimised for coating processes with different requirements and adapted, for example, to the thickness of the doped diamond layer, its purity, grain size, concentration of the doping, duration of the coating process, substrate material and/or substrate shape.

Alternatively, the carbon-containing process gas can also be introduced into the deposition chamber together with the hydrogen through the gas activation element and activated by thermal excitation. This simplifies the process control and the design of the device, as a gas inlet element is not required for introducing the carbon-containing process gas into the deposition chamber.

The weight ratio of hydrogen to the carbon-containing process gas is preferably in the range of 95:5 to 99.99:0.01, depending on the desired morphology. To accelerate diamond growth, further process gases, for instance nitrogen, oxygen and/or argon, can be used, if necessary, which can be supplied by one or more gas injection/inlet elements.

The deposition chamber is preferably operated under reduced pressure in order to favour the formation of a diamond layer on the surface of the substrate. This guarantees a high degree of purity and homogeneity of the deposited doped diamond layer. For this purpose, the deposition chamber is evacuated before the deposition process and during the deposition process. For this purpose, a vacuum pump is preferably arranged outside the device, which generates the vacuum required for the deposition process in the deposition chamber. The pressure in the deposition chamber is preferably in the range of 0.5 to 50 mbar, in particular 1 to 10 mbar. The partial pressure in the flow channel of the gas activation element is therefore preferably a multiple of the pressure in the deposition chamber.

In known HFCVD processes, due to the low excitation rate of the process gas, a small distance between the gas activation element and the substrate (usually in the range of 5 to 10 mm) must be selected, which leads to a highly inhomogeneous temperature distribution on the substrate surface, the occurrence of localised concentrations of hot, atomic hydrogen and consequently to an inhomogeneous coating. In the process according to the invention, the comparatively high excitation rate of the process gas makes it possible to provide a greater distance between the gas activation element and the substrate surface, which is preferably in the range of 20 to 100 mm, particularly preferably in the range of 40 to 60 mm. This greater distance between the gas activation element and the substrate in the process according to the invention ensures a homogeneous temperature distribution of the substrate surface.

Substrate materials that can be used include hard metals, silicon wafers, titanium implants, electrode materials (e.g. silicon, titanium, tantalum, tungsten, molybdenum, copper, niobium), graphite, sapphire, high-melting glass and/or quartz. To further improve the adhesion of the coating, the surface of the substrate materials can also be pretreated if necessary, for example to increase the roughness and thus the mechanical anchoring/adhesion.

The substrate temperature can range from 500 to 950° C. depending on the substrate and coating parameters. Preferably, a substrate temperature in the range of 750 to 850° C. is used, which leads to the deposition of a very homogeneous, doped diamond layer. It should be noted that at lower temperatures (below the preferred temperature range, for example at 600° C. or below) the growth rate is correspondingly lower. This may make it necessary to adjust the process parameters. The substrate to be coated can be arranged inside the deposition chamber on a substrate holder, which is preferably located below or to the side of the gas activation element in the operating state of the deposition chamber. Depending on the temperature resistance/stability of the substrate, the substrate holder can be connected to a cooling device. Due to the possibility of cooling the substrate and the comparatively large distance between the substrate and the gas activation element, more temperature-sensitive substrates such as glass can also be coated, whereby the substrate temperature for more temperature-sensitive substrates is preferably in the range of 500 to 700° C. This enables the deposition of a homogeneous doped diamond layer, whereby damage to the more temperature-sensitive substrate can be avoided at the same time.

The orientation of the gas activation element can preferably be adapted to the shape of the substrate. Preferably, the gas activation element is arranged horizontally and thus parallel to the substrate surface in the deposition chamber. This ensures a uniform distance between the gas activation element and the substrate, particularly in the case of a two-dimensional substrate, so that the doped diamond layer has a uniform thickness over the entire substrate surface. The gas activation element can also be arranged inside a hollow substrate to be coated (e.g. inside a forming tool or drawing die) or on the side of a complex 3D substrate. By arranging several outlet openings on the corresponding side surfaces of the gas activation element, a uniform coating of the interior of the hollow substrate or the 3D structure is then possible.

In a preferred embodiment of the present invention, several gas activation elements are provided in the deposition chamber. This is advantageous, for example, for coating large-area substrates, such as silicon wafers, or for coating three-dimensional substrates. It is also possible to coat several substrates simultaneously. The heating device can be designed in such a way that the gas activation elements can be heated separately, together or in several groups. The various gas activation elements can also be connected to separate gas supply lines, allowing different process gases to be fed into the deposition chamber above the individual gas activation elements. The properties of the coating can thus be adjusted locally, for example the doping concentration in the doped diamond layer and the resulting properties, such as the electrical conductivity.

The shape and arrangement of the gas activation element or gas activation elements can be of any design and is preferably orientated to the shape of the substrate to be coated. If several gas activation elements are used, these are preferably arranged parallel to each other. This ensures that the entire substrate surface can be coated homogeneously. When coating a two-dimensional substrate, all gas activation elements are preferably arranged parallel and at the same distance from the substrate. A homogeneous temperature distribution and, accordingly, a homogeneous coating of the substrate is ensured by selecting the respective distances accordingly.

The substrate, which is located on a substrate holder below the gas activation system, is preferably moved in a horizontal plane. The substrate, which is positioned to the side of the gas activation element, can be moved by rotation. Naturally, the speed at which the substrate is moved is adapted to the process parameters.

All embodiments of the present invention are interrelated, and any embodiment and/or characteristic feature disclosed may be combined with each other and also as any combination of two or more embodiments and/or features.

For the purposes of this disclosure, indications such as "top", "bottom", "above", "below", etc. refer to the intended operating state of the CVD device.

In this application, the term "process gas" refers both to a single gas (such as hydrogen) and to a gas mixture (consisting of hydrogen and another gas, such as a carbon-containing gas), unless explicitly disclosed otherwise.

The invention is further explained below with reference to preferred embodiments and descriptions of figures, to which, however, it is not intended to be limited.

Figure 1:
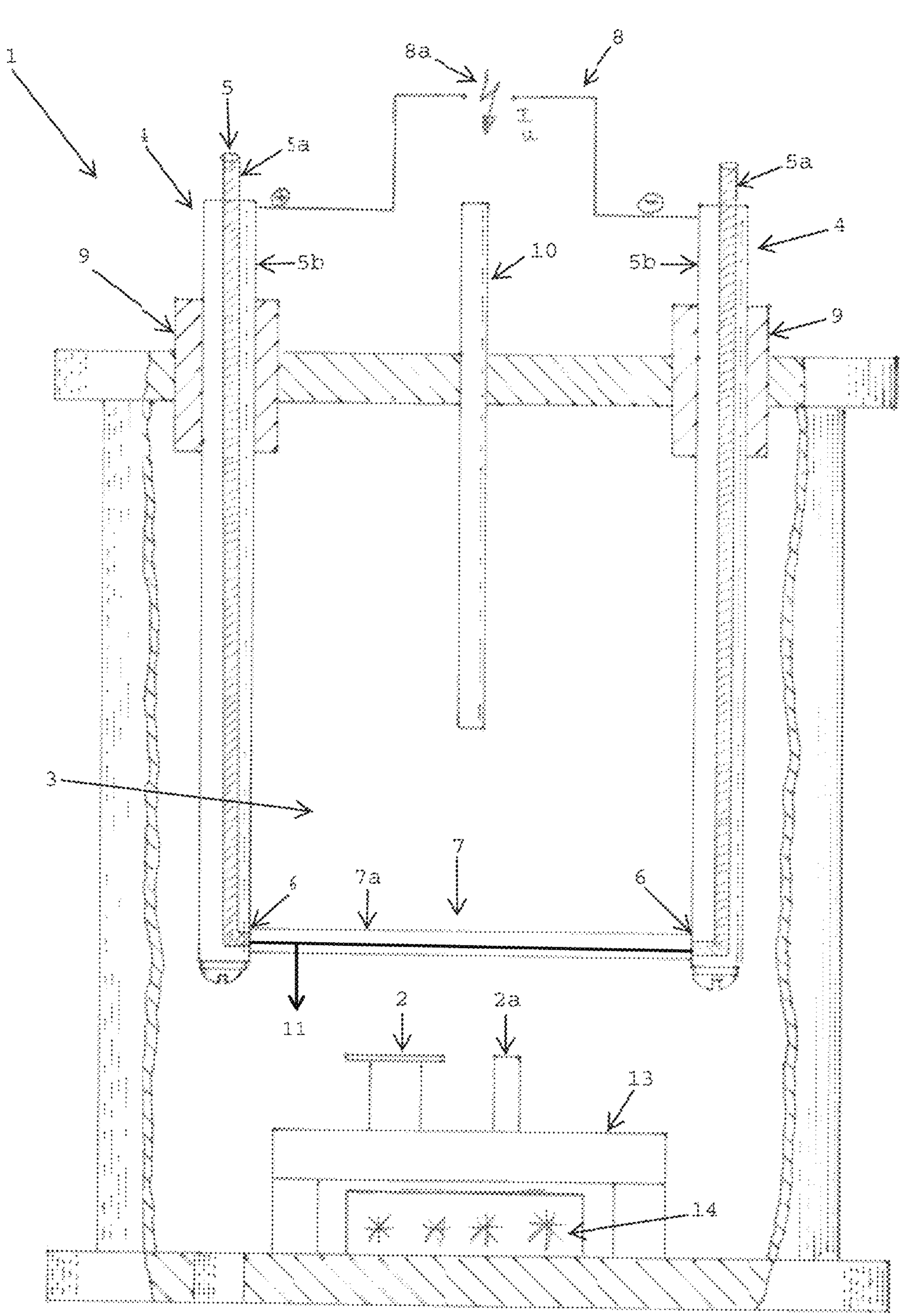
FIG. 1 shows a device according to the invention for applying a doped diamond layer to substrates by chemical vapour deposition.

FIG. 1 shows a device 1 for applying a doped diamond layer to substrates 2, 2*a*. In the design shown, the doped diamond layer is deposited on the outside of the substrate 2 on the one hand and on the inside of the substrate 2*a* on the other. The device 1 has a deposition chamber 3 for holding the substrates 2, 2*a*. A gas and electricity supply element 4 is also provided. The gas and electricity supply element 4 has an inner element 5*a* for supplying a process gas (preferably hydrogen) and an outer element 5*b* made of an electrically conductive material for supplying an electric current.

As can also be seen from FIG. 1, the gas and electricity supply element 4 inside the deposition chamber 3 is connected via a clamping screw connection 6 to a gas activation element 7 arranged horizontally in the arrangement shown in such a way that the process gas can be fed into the gas activation element 7 via the inner element 5*a* of the gas and electricity supply element 4. Inside the gas activation element there is a solid precursor other than carbon, which is provided in the form of a wire 11. Furthermore, a heating device 8 is shown (only schematically), with which a wall 7*a* of the gas activation element 7 is heated.

In the embodiment shown in FIG. 1, the heating device 8 has a power supply 8*a* (only symbolically illustrated), with which an electric current can be conducted to the gas activation element 7 via the outer element 5*b* of the gas and electricity supply element 4. The electrical current is converted into heat due to the resistance of the material of the gas activation element 7, which causes the gas activation element 7 to heat up. The wall 7*a* of the gas activation element 7 is heated so that a flow channel 7*b* in the gas activation element is heated to at least 2000° C. As a result, the process gas is activated by thermal excitation and impact excitation and the solid precursor is activated by thermal excitation. For this purpose, the wall 7*a* of the gas activation element 7 is made of a high-temperature-resistant material. Electrical insulation 9, for example made of a ceramic material, is also provided between the outer element 5*b* of the gas and current supply element 4 and a housing of the deposition chamber 3.

FIG. 1 also shows a gas inlet element 10 arranged vertically at the top of the deposition chamber 3 in the version shown, through which a carbon-containing process gas (preferably methane) can be introduced into the deposition chamber 3. The carbon-containing process gas is thermally excited by flowing over the heated wall 7*a* of the gas activation element 7, so that carbon-containing radicals (for example methyl radicals) are generated. Alternatively, the carbon-containing process gas can also be introduced into the deposition chamber 3 together with hydrogen in a defined mixing ratio through the heated gas activation element 7 and thereby activated. Other process gases, for instance nitrogen, oxygen or argon, can also be fed in via other gas inlet elements (not shown). A substrate holder 13, on which the substrates 2, 2*a* are arranged, is located inside the deposition chamber 3 and below the gas activation element 7. The substrate holder 13 can be heated or cooled via a temperature control element 14 (shown schematically).

Figure 2A:
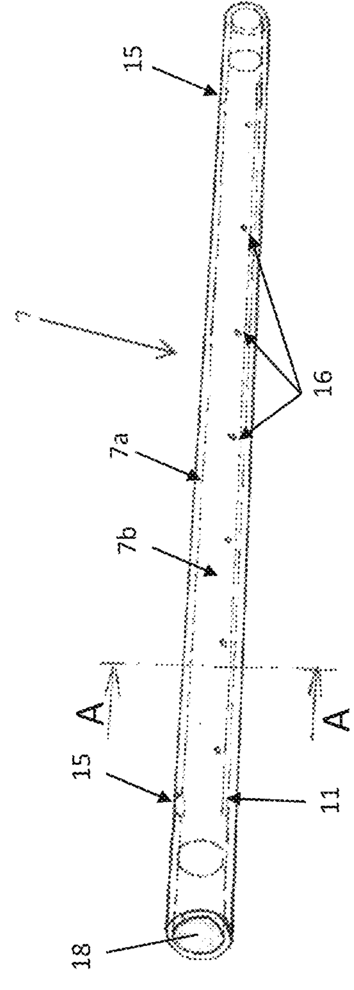
FIG. 2-4 shows a gas activation element with different numbers of wires, which are provided as a solid precursor other than carbon.
Figure 2B:
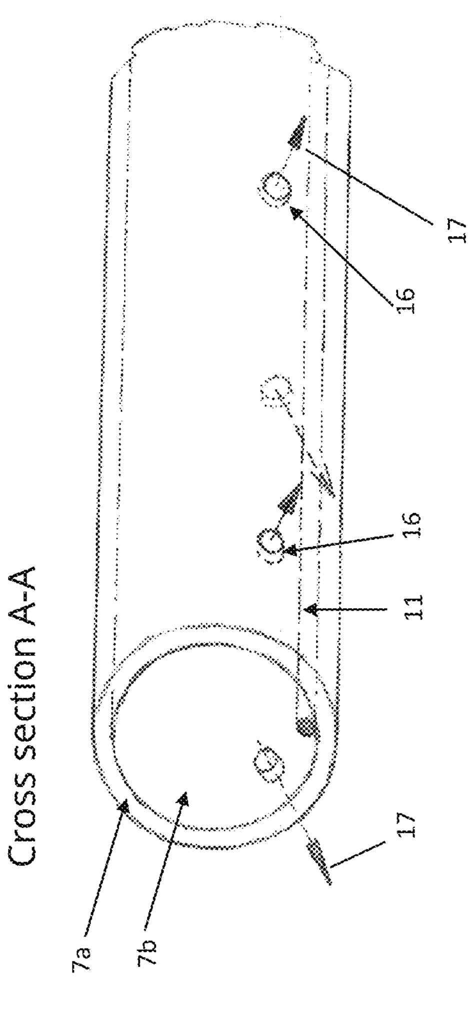
Figure 3A:
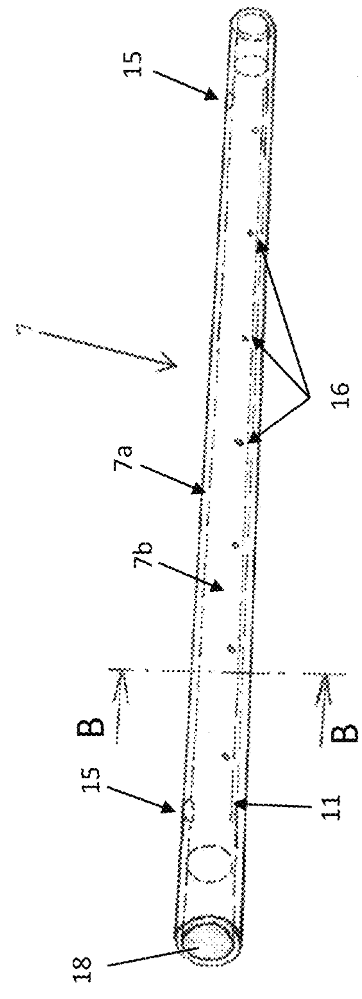
Figure 3B:
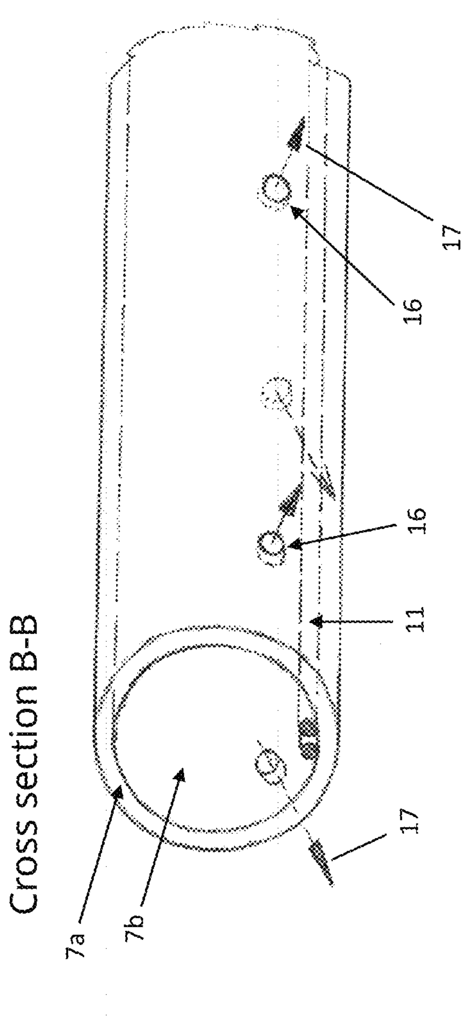
Figures 4A, 4B:
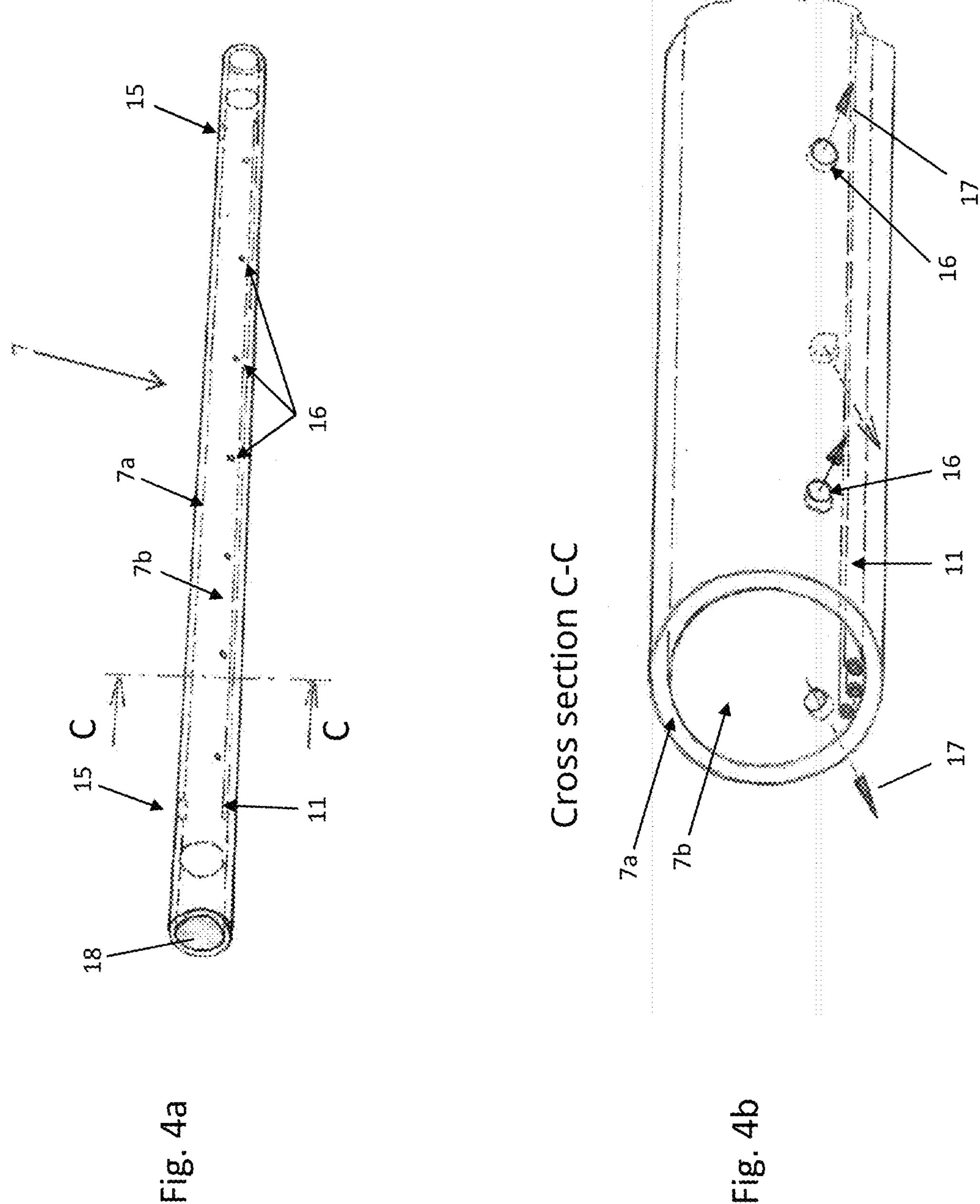

FIGS. 2*a*, 3*a* and 4*a* show an embodiment of the gas activation element 7, in whose flow channel 7*b* a solid precursor other than carbon in the form of a wire 11 is provided in the longitudinal direction. FIGS. 2*b*, 3*b* and 4*b* each show a section through the gas activation element 7. It can be seen that FIGS. 2-4 differ in the number of wires 11 provided in the flow channel 7*b*. In FIG. 2, one wire 11 is provided in the flow channel 7*b*, in FIG. 3 two wires 11 are provided and in FIG. 4 three wires 11 are provided.

As further shown in FIGS. 2-4, the gas activation element 7 has an inlet opening 15 in each of the two end regions, through which the process gas (preferably hydrogen) is fed into the flow channel 7*b* of the gas activation element 7. In addition, the gas activation element 7 has a plurality of outlet openings 16 arranged in the longitudinal direction of the gas activation element 7, laterally on its lateral surface. The activated process gas and the activated precursor are channeled through these outlet openings 16 in the direction of the substrates 2 and 2*a*; the direction of flow is illustrated by arrows 17. Furthermore, end bodies 18 for closing the flow channel 7*b* at the ends of the gas activation element 7 can be seen schematically.

Figure 5:
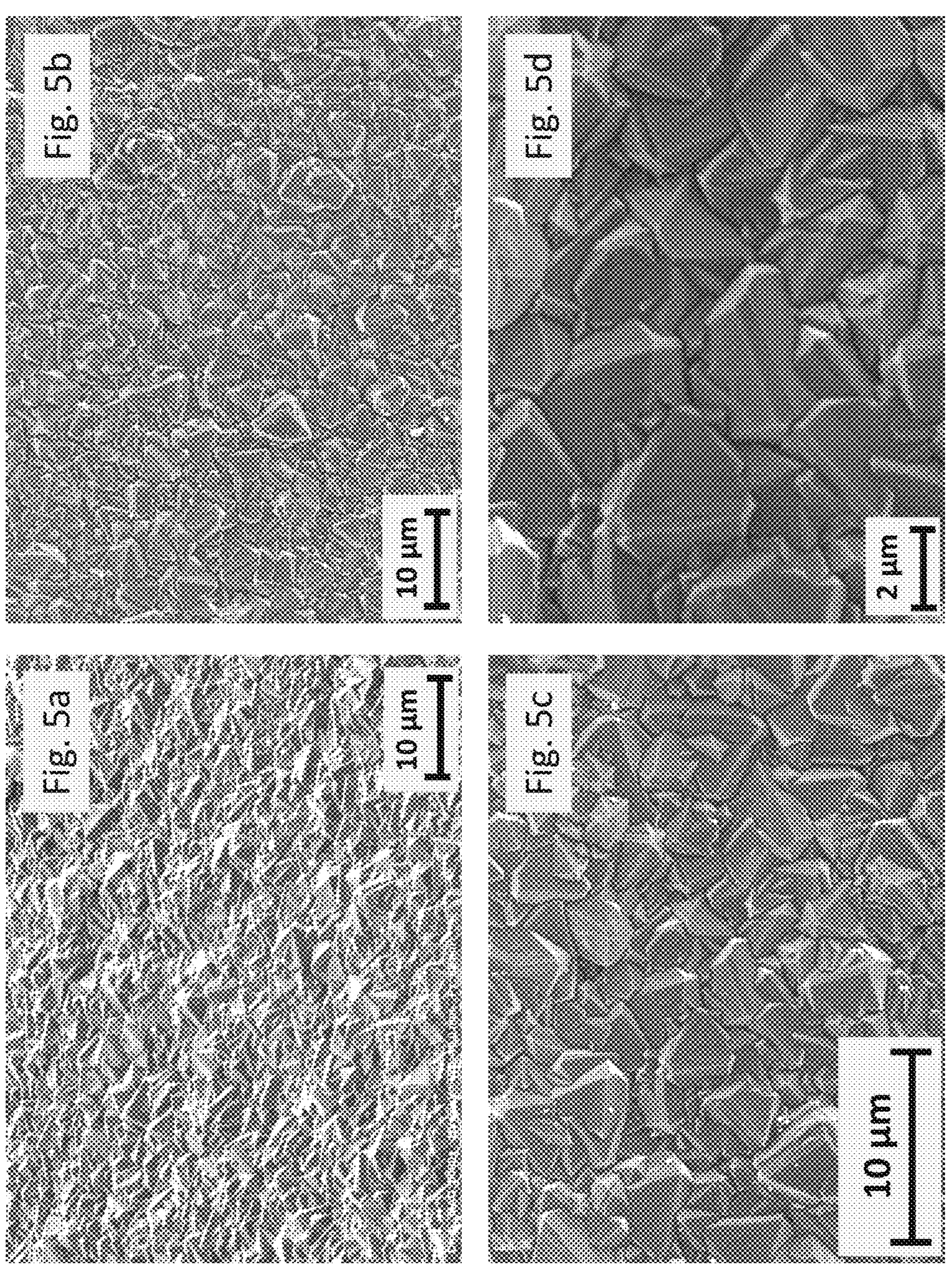
FIG. 5 shows SEM images of a boron-doped diamond layer.

FIG. 5*a-d* show SEM images of a boron-doped, microcrystalline diamond layer on a tungsten carbide-cobalt hard metal tool (WC-Co hard metal tool) with a layer thickness of 10 μm. Boron wires of type B 005915, Goodfellow Cambridge Ltd, England, were used in the flow channel of the gas activation element. Hydrogen and methane were used as process gases in a weight ratio of 99.8:0.2. The pressure in the deposition chamber was 1 mbar and the substrate temperature was 850° C. In FIG. 5*a*, a boron wire was used as a solid precursor (type B 005915, Goodfellow Cambridge Ltd., England). FIGS. 5*b-d* show a doped diamond layer, for the production of which two boron wires (type B 005915) were used as a solid precursor, at different magnifications.

EXAMPLES

The following examples are intended to further illustrate the invention as described in this application, without limiting the scope of the invention.

A WC-Co hard metal tool was coated with diamond coatings with different boron concentrations. One to three boron-containing wires (type B 005915, Goodfellow Cambridge Ltd., England) were used as a solid precursor in the flow channel of the gas activation element. These are continuous single filaments with a tungsten core (core diameter of 5 μm), a wire diameter of 0.2 mm and a wire length of 140 mm. The process parameters were kept constant for all coatings. Hydrogen and methane were used as process gases in a weight ratio of 99.8:0.2. The pressure in the deposition chamber was 1 mbar and the substrate temperature was 850° C.

The concentration of boron atoms in the boron-doped diamond layers produced according to the invention was determined using secondary ion mass spectrometry (SIMS). This measurement revealed a boron concentration in the range of $10^{20}$ to $10^{21}$ boron atoms/cm$^3$, whereby the boron concentration varies depending on the penetration depth (up to 1.5 μm). As shown in Table 1, the sheet resistance and the specific resistance of the boron-doped diamond layers decrease significantly with an increasing number of boron-containing wires (which were used for the production of the boron-doped diamond layers according to the invention) and accordingly with an increasing boron concentration, which leads to a significant increase in the electrical conductivity.

TABLE 1

Resistance measurement (2-point method, length: 10 mm) of a diamond coating produced with different numbers of boron wires (microcrystalline diamond coating, coating thickness: 10 μm, substrate: WC—Co hard metal)

| Layer on WC—Co hard metal substrate | Sheet resistance (Ω) | Specific resistance ρ(Ω m) | Electrical conductivity σ(S/m) |
|---|---|---|---|
| uncoated | 0.3 | | |
| Undoped diamond | >Detection limit | | |
| Boron-doped diamond (1 boron-containing wire) | 100-489 | 110 | $9.1 \cdot 10^{-3}$ |
| Boron-doped diamond (2 boron-containing wires) | 13.2 | 2.9 | 0.35 |
| Boron-doped diamond (3 boron-containing wires) | 2.05 | 0.4 | 2.5 |

The invention claimed is:

1. A process for applying a doped diamond layer to a substrate by chemical vapour deposition comprising the steps of:

(a) providing the substrate and a gas activation element in the form of a hollow body with a flow channel in a deposition chamber, (b) providing a precursor other than carbon in the solid state inside the flow channel, (c) heating a wall of the gas activation element with a heating device, said wall surrounding the flow channel, (d) introducing a process gas into the flow channel of the gas activation element, (e) activation of the process gas by impact excitation and thermal excitation, and activation of the precursor by thermal excitation, (f) introducing the activated process gas and the activated precursor through an outlet opening of the gas activation element into the deposition chamber, and (g) deposition of a doped diamond layer on the substrate.

2. The process according to claim 1, wherein the solid precursor is selected from the group comprising boron, silicon, lithium, sodium, phosphorus, nitrogen, sulphur, arsenic or a combination thereof.

3. The process according to claim 1, wherein boron-containing particles, a boron-containing wire or a combination thereof is or are provided as a solid precursor.

4. The process according to claim 3, wherein the solid precursor is the boron-containing particles.

5. The process according to claim 1, wherein a gas inlet element for introducing a further process gas, is arranged in the deposition chamber in such a way that the further process gas flows over the heated wall of the gas activation element.

6. The process according to claim 5, wherein the process gas is a carbon-containing process gas.

7. The process according to claim 1, wherein the process gas is hydrogen.

* * * * *